United States Patent
Huang

(10) Patent No.: US 6,856,207 B1
(45) Date of Patent: Feb. 15, 2005

(54) JITTER-LESS PHASE DETECTOR IN A CLOCK RECOVERY CIRCUIT

(75) Inventor: Chen Wen Huang, Taipei (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 42 days.

(21) Appl. No.: 10/628,444

(22) Filed: Jul. 29, 2003

(51) Int. Cl.[7] .......................... H03D 13/00; H03L 7/089
(52) U.S. Cl. ........................ 331/27; 331/1 A; 331/25; 327/12
(58) Field of Search .......................... 331/1 A, 18, 25, 331/27; 327/2, 3, 5, 7, 8, 10, 12, 156–159

(56) References Cited

U.S. PATENT DOCUMENTS

| | | | | |
|---|---|---|---|---|
| 5,081,655 A | * | 1/1992 | Long | .......................... 375/373 |
| 5,307,028 A | * | 4/1994 | Chen | .......................... 331/1 A |
| 5,602,512 A | * | 2/1997 | Neron | .......................... 331/1 A |

* cited by examiner

Primary Examiner—David Mis
(74) Attorney, Agent, or Firm—Bacon & Thomas PLLC

(57) ABSTRACT

A jitter-less phase detector in a clock recovery circuit is disclosed. A first control signal generating circuit generates a first control signal by inverting and delaying input data signals through half clock. A second control signal generating circuit generates a high level second control signal when the data signal changes. A phase comparator generates an up signal having a high-level from the falling edge of the first control signal to the falling edge of the second control signal, and generates a down signal having a high-level from the falling edge of the second control signal to the falling edge of the first control signal, so as to control a pair of current sources to selectively discharge and charge a capacitor.

5 Claims, 8 Drawing Sheets

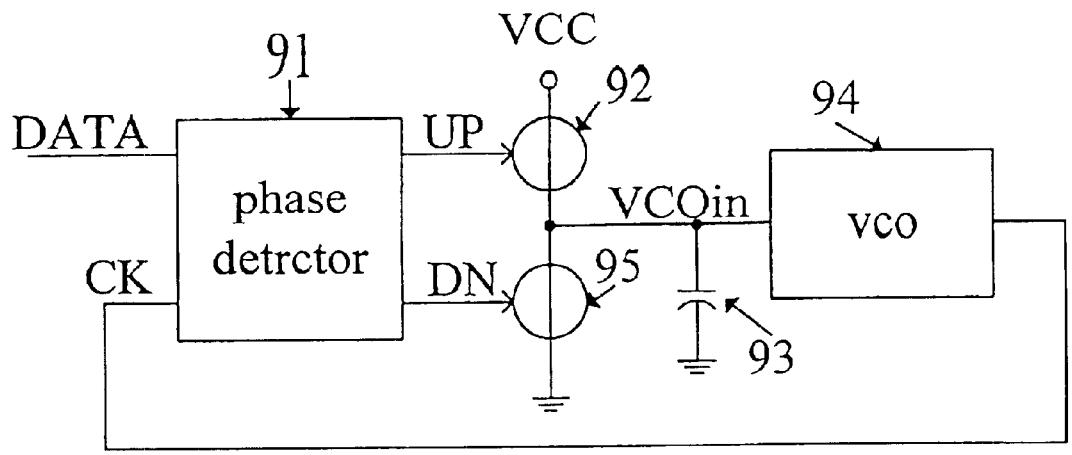
FIG. 1A PRIOR-ART
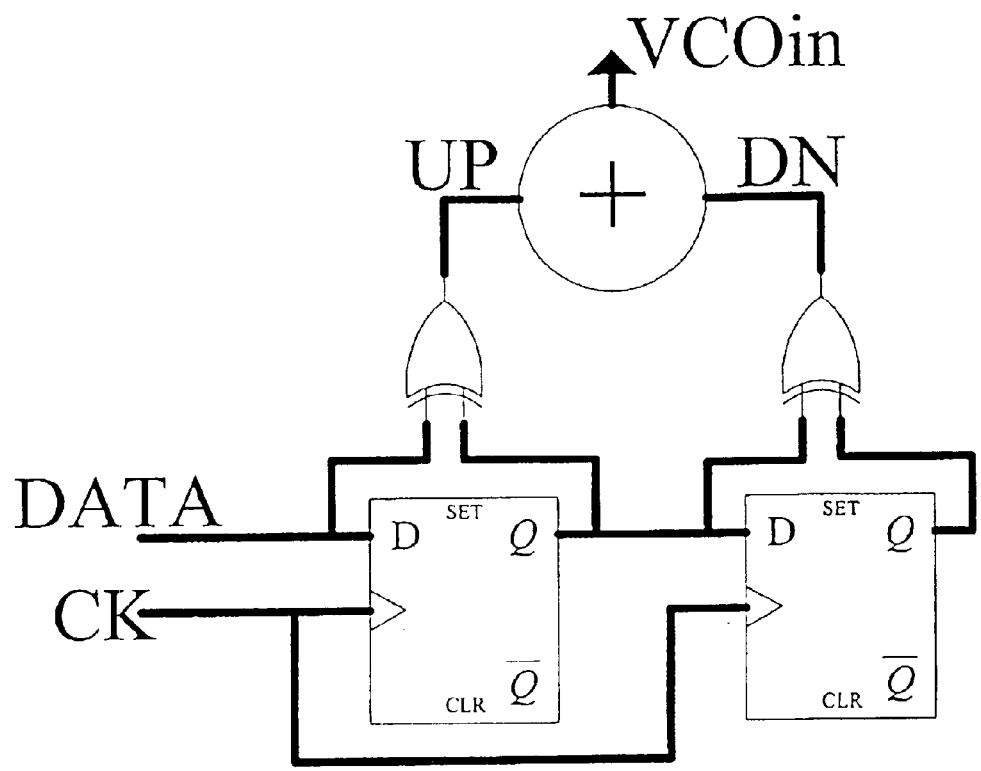
FIG. 1B PRIOR-ART

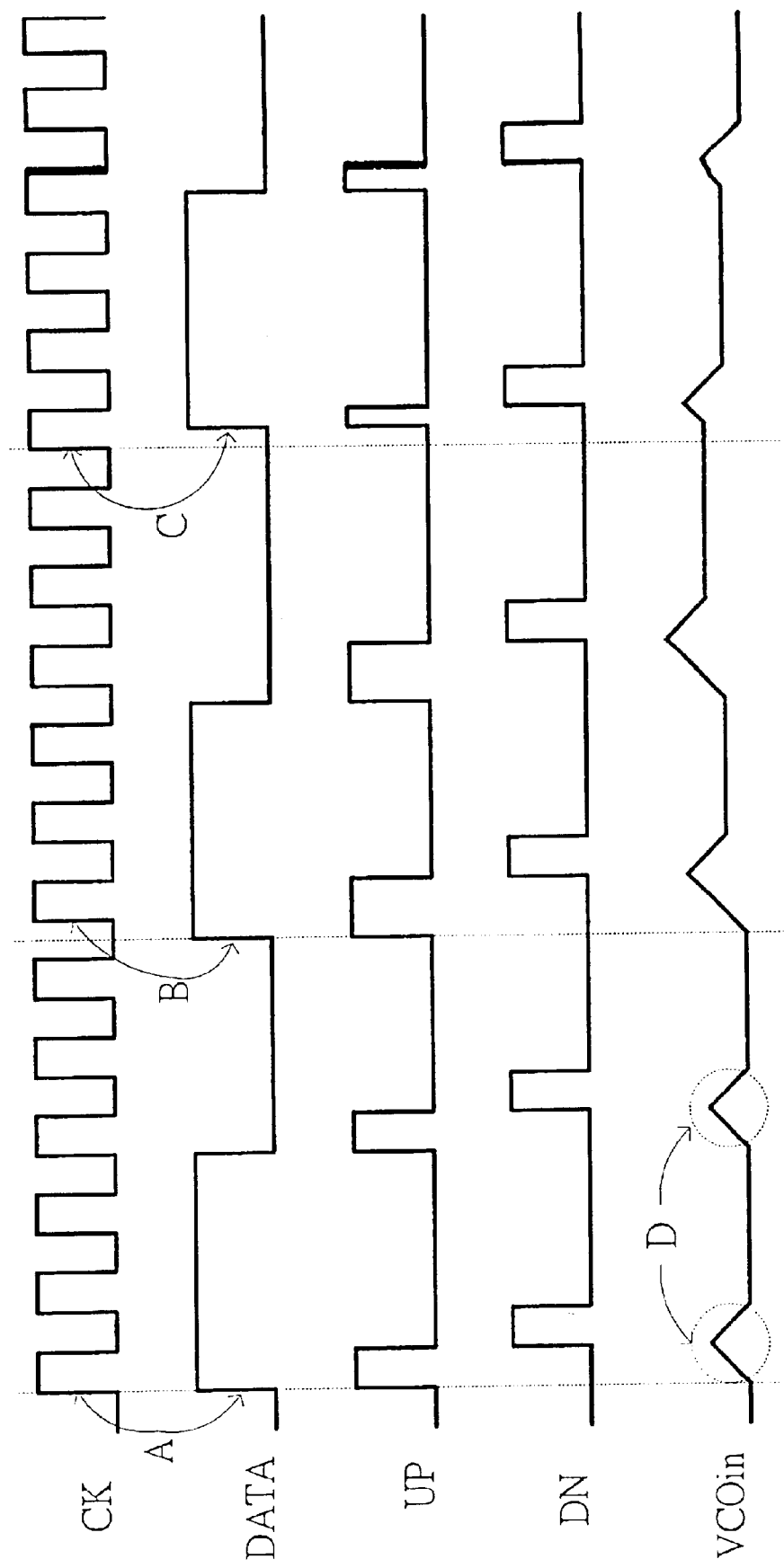
FIG. 1C PRIOR-ART

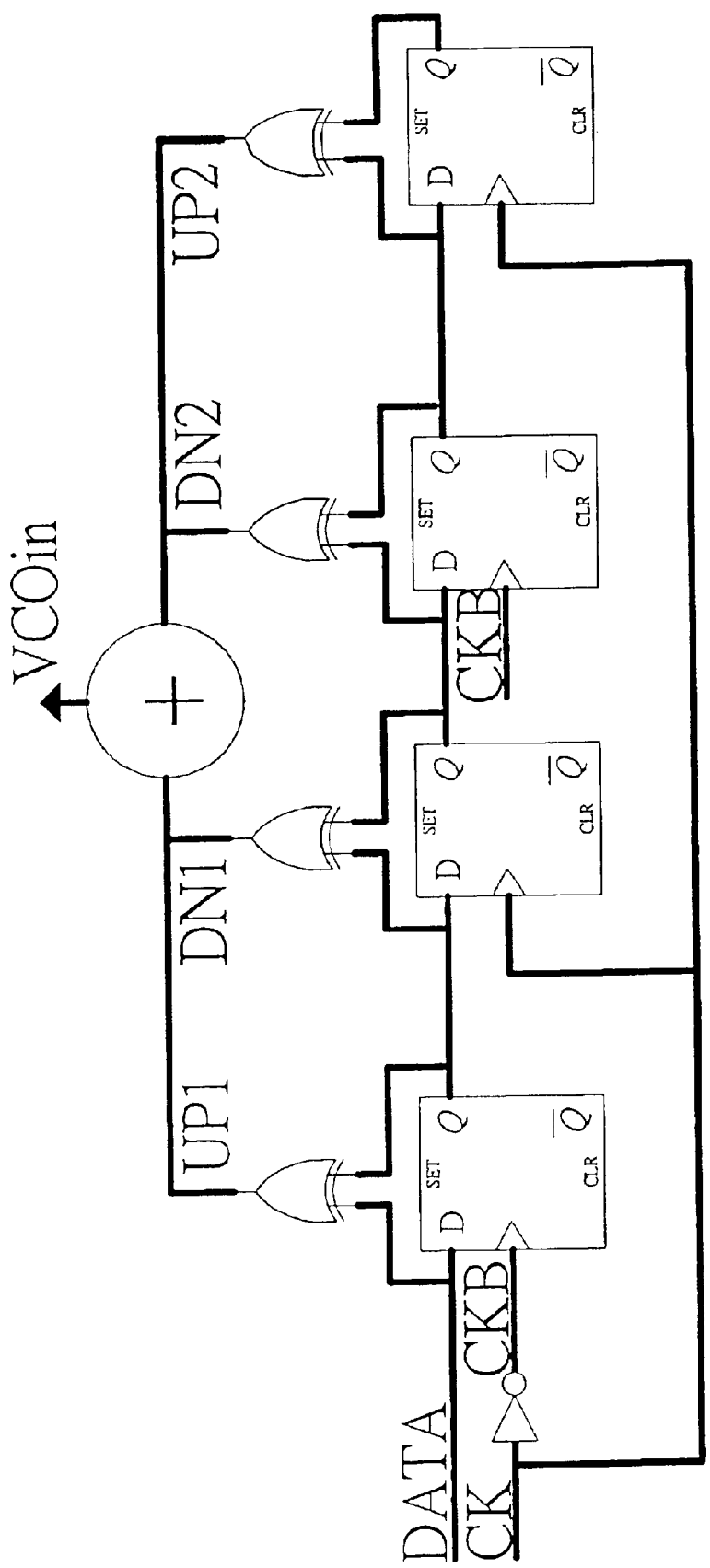
FIG. 2A PRIOR-ART

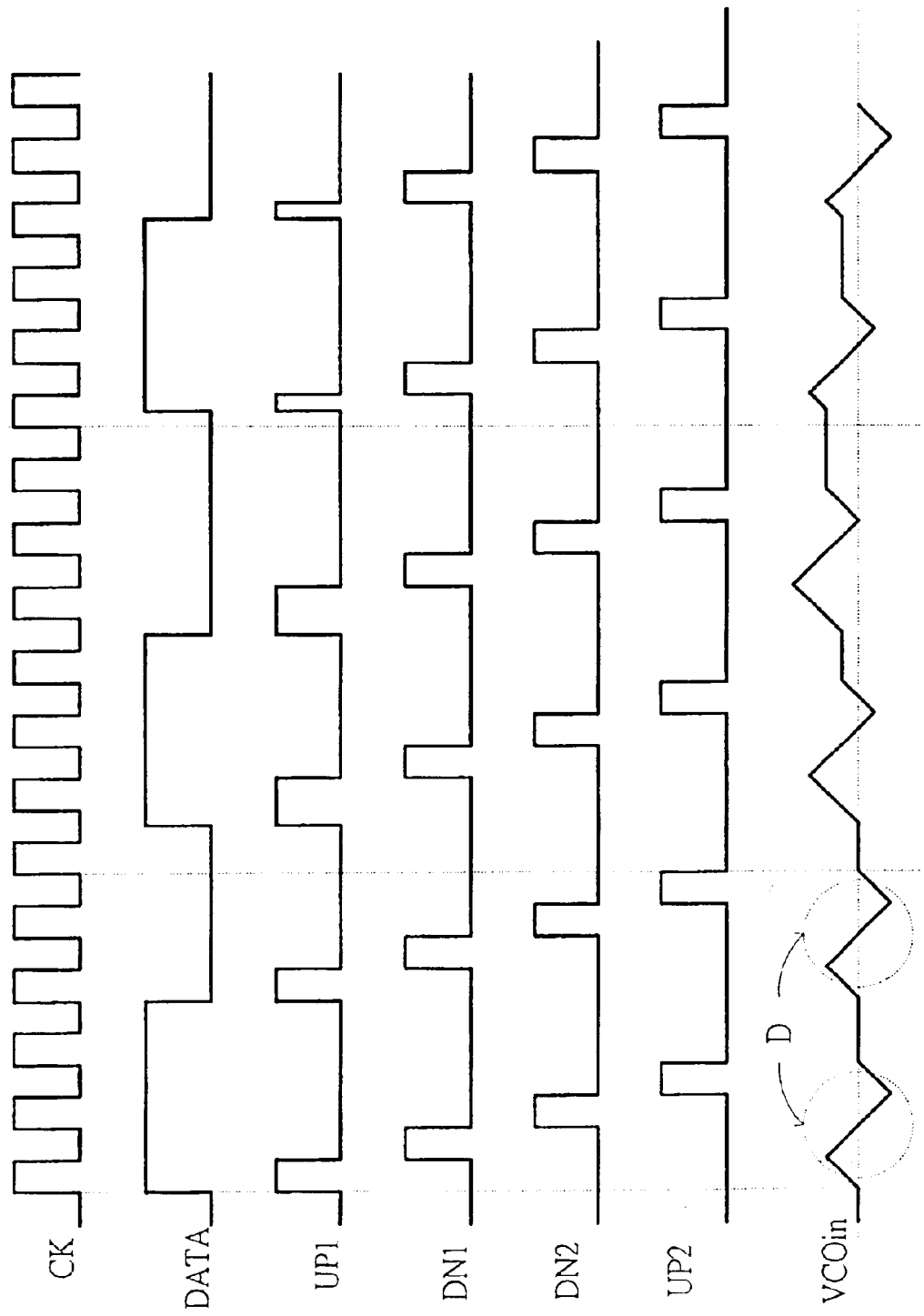
FIG. 2B PRIOR-ART

JITTER-LESS PHASE DETECTOR IN A CLOCK RECOVERY CIRCUIT

FIELD OF THE INVENTION

The present invention relates to a phase detector and, more particularly, to a jitter-less phase detector in a clock recovery circuit.

BACKGROUND OF THE INVENTION

With the development of electronic technology, the dimension of electronic device is getting smaller and more compact. To save space and increase transmission speed, the serial transmission technology is in wide spread use. For example, the loader of the DVD-ROM or CD-ROM transfers signals serially. In such a serial transmission, a clock is recovered from the received data. Only when the correct clock is enssured, the receiver can sample the received data correctly.

Referring to FIG. 1A, a conventional clock recovery circuit is illustrated. When the phase of a clock signal is lagged to the phase of DATA signal, the phase detector 91 outputs a frequency increasing signal (UP signal) for activating a current source 92 and charging a capacitor 93. The voltage VCOin of the capacitor 93 will be increased due to charging of the capacitor 93. When the voltage VCOin is increased, the frequency of the output signals of a voltage-controlled oscillator 94 will be increased for compensating the lag phase of the clock CK. When the phase of the clock signal CK is leading the phase of the data signal DATA, the phase detector 91 outputs a frequency decreasing signal (DN signal) for driving a current source 95 and the capacitor 93 will be discharged. The voltage VCOin of the capacitor 93 will be decreased due to the discharge. After the voltage VCOin is decreased, the frequency of the output signal of the voltage-controlled oscillator 94 is also decreased so that the phase of the clock signal CK is lagged to be in-phase with the data signal DATA.

FIGS. 1B and 1C show the circuit and time sequence of the phase detector 91 of the clock recovery circuit. In FIG. 1C, arrow A represents that the clock signal CK and data signal DATA are in phase, arrow B represents that phase of the signal CK is lagged of the data signal DATA, and arrow C represents that phase of the signal CK is led of the data signal DATA. When the clock signal CK is in-phase with the data signal DATA, the voltage VCOin still exists, as indicated by arrow D in FIG 1C. This will cause jitter in the clock signal and meanwhile, the voltage VCOin generates a DC offset so that the phase of the clock CK has offset with respect to the phase of the data signal DATA.

FIGS. 2A and 2B show the improved circuit and time sequence of the clock recovery circuit for solving the aforementioned problem. As shown in the FIG. 2B, the phase detector 91 can eliminate the DC offset of the voltage VCOin, while as indicating by arrow D of FIG. 2B, it is found that the clock still has jitters.

Therefore, it is desirable to provide an improved phase detector with jitter-less for a clock recovery circuit to mitigate and/or obviate the aforementioned problems.

SUMMARY OF THE INVENTION

Accordingly, the primary object of the present invention is to provide a jitter-less phase detector in a clock recovery circuit, wherein the jitter of a clock recovery circuit can be reduced effectively.

To achieve the above object, the present jitter-less phase detector in a clock recovery circuit comprises: a first control signal generating circuit for generating a first control signal by inverting and delaying input data signals through half clock (0.5T), so that the first control signal has a pulse width starting from a transition of the data signal and lasting for half clock; a second control signal generating circuit for generating a high level second control signal when the data signal changes, so that the second control signal has a pulse width starting from a transition of the data signal and terminating at a falling edge of the clock; and a phase comparator for generating an up signal having a high-level from the falling edge of the first control signal to the falling edge of the second control signal when the falling edge of the first control signal is leading the falling edge of the second control signal, and generating a down signal having a high-level from the falling edge of the second control signal to the falling edge of the first control signal when the falling edge of the second control signal is leading the falling edge of the first control signal, so as to control a pair of current sources to selectively discharge and charge a capacitor.

The various objects and advantages of the present invention will be more readily understood from the following detailed description when read in conjunction with the appended drawing.

BRIEF DESCRIPTION OF THE DRAWINGS

FIG. 1A shows a block diagram of a conventional clock recovery circuit;

FIG 1B shows a circuit diagram of a phase detector of the FIG 1A;

FIG. 1C shows a timing sequence of the FIG 1B circuit;

FIG. 2A shows another circuit diagram of the phase detector circuit;

FIG. 2B shows a timing sequence of the FIG. 2A circuit;

DETAILED DESCRIPTION OF THE PREFERRED EMBODIMENTS

Figure 3A:
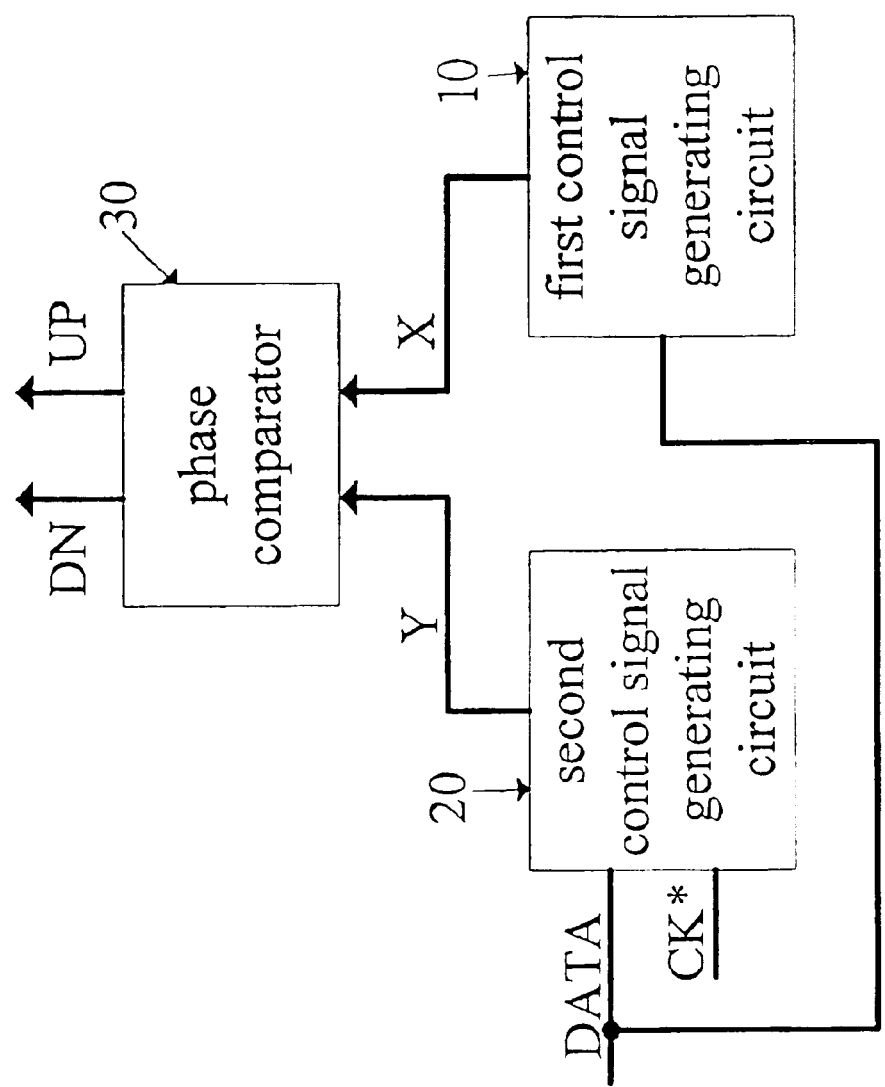
FIG. 3A shows a block diagram of the phase detector with jitter-less in a clock recovery circuit of the present invention.
Figure 3B:
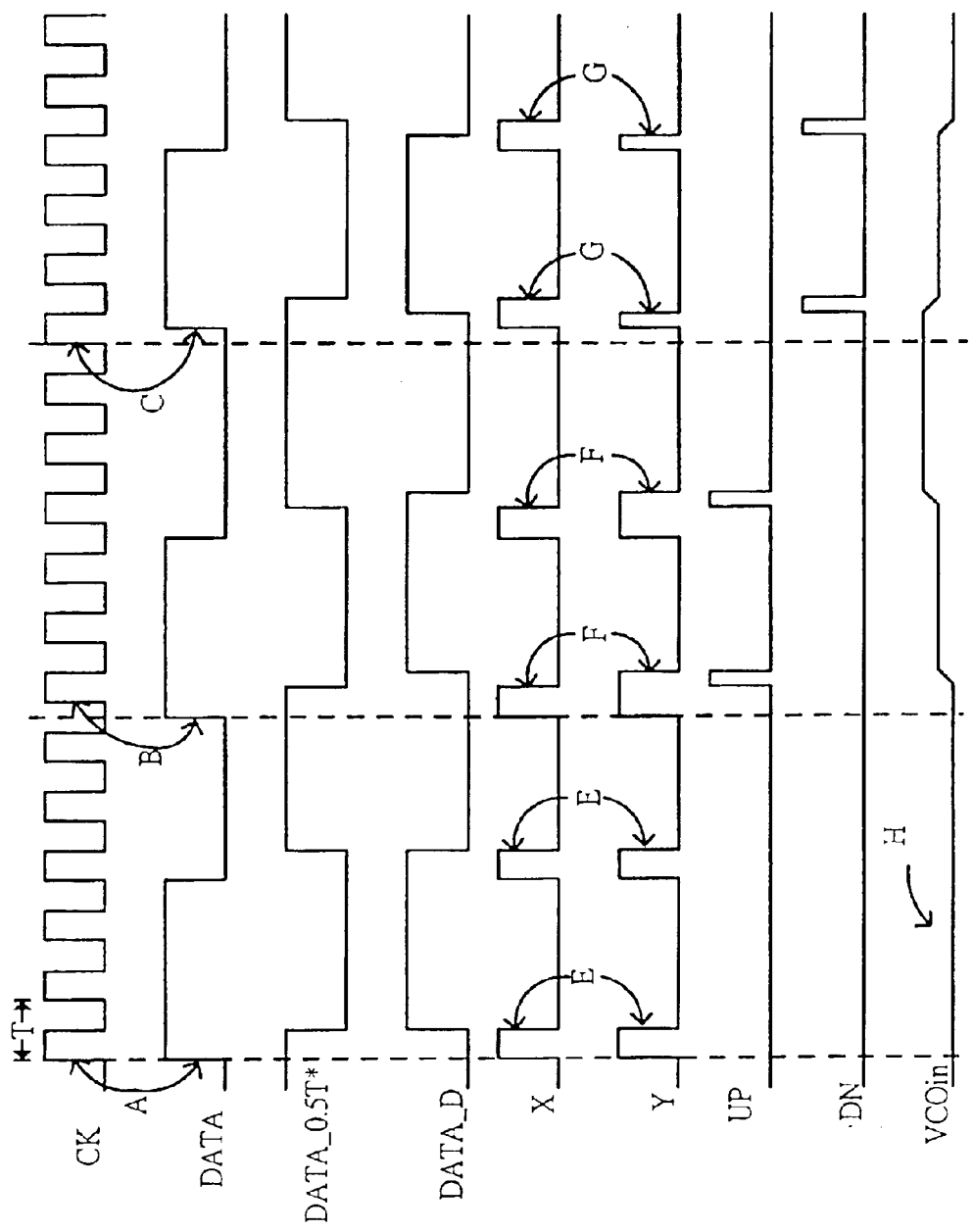
FIG. 3B shows a timing sequence of a phase detector with jitter-less in a clock recovery circuit of the present invention.

FIG. 3A shows the jitter-less phase detector in a clock recovery circuit of the present invention, which includes a first control signal generating circuit 10, a second control signal generating circuit 20, and a phase comparator 30. The first control signal generating circuit 10 generates a high-level first control signal X when the input data signal DATA is transited (from high-level to lower-level, or from lower-level to high-level). The pulse width of the first control signal X is defined to start from the transition of the data signal and last for half period (0.5T), as shown in FIG. 3B. The second control signal generating circuit 20 generates a high-level second control signal Y when the input data signal DATA is transited (from high-level to lower-level, or from lower-level to high-level). The pulse width of the second control signal Y is defined to start from the transition of the data signal and terminate at a falling edge of the clock, as shown in FIG. 3B. The phase comparator 30 generates an up signal, denoted as UP, and a down signal, denoted as DN, according to the first control signal X and the second control signal Y. When the falling edge of the first control signal X is leading the falling edge of the second control signal Y, the phase comparator 30 generates the UP signal. The high-level pulse width of the UP signal is from the falling edge of the first control signal X to the falling edge of the second control signal Y, as indicated by arrow F of FIG. 3B. When the falling edge of the second control signal Y is leading the falling edge of the first control signal X, it generates a DN signal. The high-level pulse width of the DN signal is from the falling edge of the second control signal Y to the falling edge of the first control signal X, as indicated by arrow G of FIG. 3B.

Figure 4A:
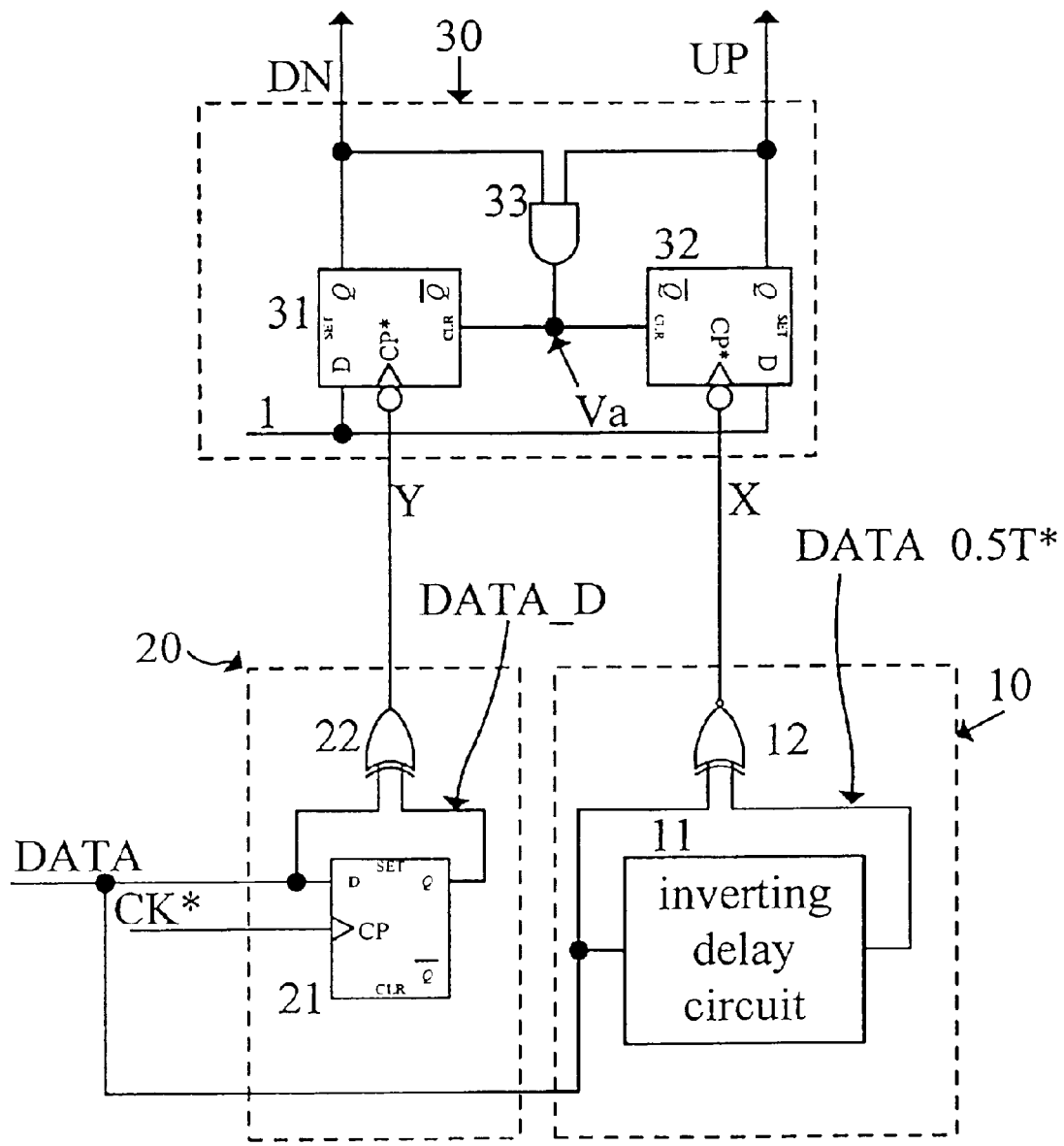
FIG. 4A shows an exemplary circuit diagram of the phase detector with jitter-less in a clock recovery circuit of the present invention.

FIG. 4A shows the circuit diagram of the jitter-less phase detector in a clock recovery circuit of the present invention. The first control signal generating circuit 10 comprises an inverting delay circuit 11 and an XNOR gate 12 for delaying the input signal with 0.5 T. The data signal DATA is applied to an input end of the inverting delay circuit 11 to generate an inverting delayed data signal DATA_0.5T*. The data signal DATA and the inverting delay data signal DATA_0.5T* are applied to the input ends of the XOR gate 12. After being operated by the XOR gate 12, the first control signal X is generated.

The second control signal generating circuit 20 is formed by a D-type flip-flop 21 and an XOR gate$_{22}$. The clock end CP of the D-type flip-flop 21 is connected to an inverse clock signal CK*. The data signal DATA is applied to the data input end D of the D-type flip-flop 21. A DATA_D signal is outputted from the D-type flip-flop 21. The DATA_D signal and the data signal DATA are applied to the input ends of the XOR gate 22. After operation of the XOR gate 22, the second control signal Y is generated.

The phase comparator 30 comprises a D-type flip-flop 31, a D-type flip-flop 32, and an AND gate 33. The first control signal X and the second control signal Y are applied to the inverted clock input ends of the flip-flop 31 and flip-flop 32, respectively. The data input ends D of the D-type flip-flop 31 and D-type flip-flop 32 are connected to high-level voltage (1). The outputs Q of the D-type flip-flop 31 and D-type flip-flop 32 are labeled as UP signal and DN signal. The UP signal and DN signal are applied to the input ends of the AND gate 33. The output of the AND gate 33 is connected to the reset ends (CLR) of the D-type flip-flop 31 and D-type flip-flop 32, respectively.

When the levels of the first control signal X and second control signal Y change from low-level to high-level simultaneously, and then change from high-level to low-level simultaneously again, the UP and DN signals are at high-level in advance simultaneously. The voltage Va outputted from the AND gate 33 is at high-level and it will asynchronously reset the D-type flip-flop 31 and D-type flip-flop 32, such that UP and DN signals change to low-level simultaneously. Then, voltage Va changes to low-level. Since DN and UP signals change to low-level simultaneously, the voltage of VCOin is equal to 0, as indicated by arrow H of FIG. 3B. When the first control signal X and second control signal Y change from low-level to high-level simultaneously, and the first control signal X changes from high-level to lower-level before the transition of the second control signal Y, the transition of the first control signal X from high-level to low-level will cause the UP signal to change to high-level. When the second control signal Y changes from high-level to low-level, the UP signal will change to low-level, as indicated by arrow F of FIG. 3B. Under the condition that the first control signal X and second control signal Y change from low-level to high-level, and the second control signal Y changes from high-level to low-level before the transition of the first control signal X, when the second control signal Y changes from high-level to low-level, the DN signal will change to high-level. When the first control signal X changes from high-level to low-level, the DN signal will change to low-level, as indicated by arrow G of FIG. 3B. Under the condition that the first control signal X and second control signal Y change from low-level to high-level and the first control signal X and the second control signal Y change from low-level to high-level, the clock signal CK and the data signal DATA are in phase and the voltage VCOin is equal to 0, as indicated by arrow H in FIG. 3B. Therefore, the jitter of clock is reduced and meanwhile the DC offset generated by the voltage VCOin is cancelled.

Figure 4B:
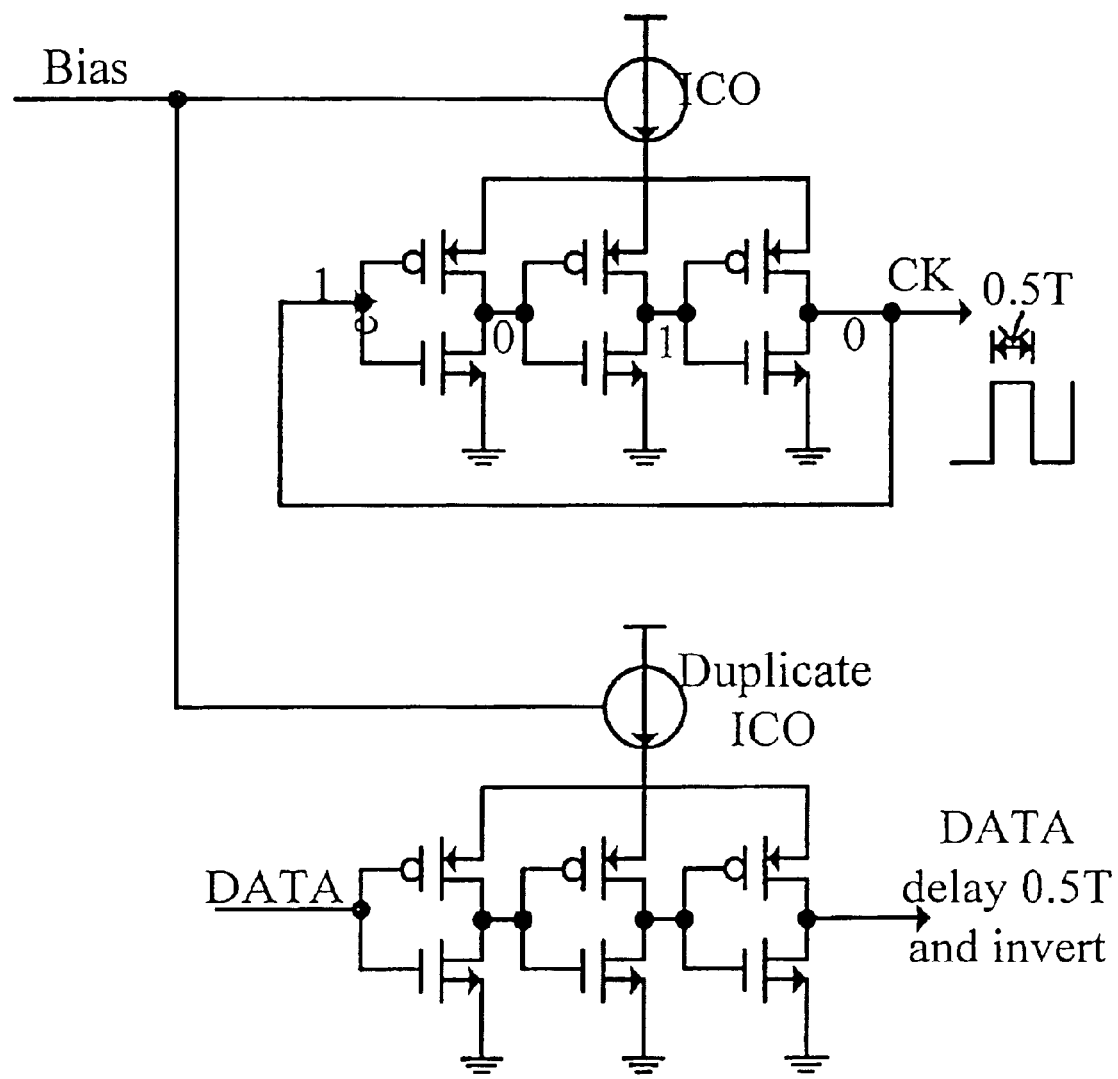
FIG. 4B shows an exemplary circuit of the inverted delay circuit of FIG. 4A.

FIG. 4B shows a detail circuit of the inverted delay circuit 11 in FIG. 4A. The data signal DATA passes through three CMOS gates for generating an inverted signal DATA 0.5T* with a 0.5T delay. When the clock signal passes through three CMOS gates, the signal level changes from high-level to low-level or from low-level to high-level. That is, the path delay of the three CMOS gates is also half clock of the clock signal (0.5T). Therefore, when the data signal DATA passes through three CMOS gates, a delay of 0.5T and an inverted second signal DATA_0.5T* are generated. Although the present invention has been explained in relation to its preferred embodiment, it is to be understood that many other possible modifications and variations can be made without departing from the spirit and scope of the invention as hereinafter claimed.

What is claimed is:

1. A jitter-less phase detector in a clock recovery circuit comprising:
   a first control signal generating circuit for generating a first control signal by inverting and delaying input data signals through half clock (0.5T), so that the first control signal has a pulse width starting from a transition of the data signal and lasting for half clock;
   a second control signal generating circuit for generating a high level second control signal when the data signal changes, so that the second control signal has a pulse width starting from a transition of the data signal and terminating at a falling edge of the clock; and
   a phase comparator for generating an up signal having a high-level from the falling edge of the first control signal to the falling edge of the second control signal when the falling edge of the first control signal is leading the falling edge of the second control signal, and generating a down signal having a high-level from the falling edge of the second control signal to the falling edge of the first control signal when the falling edge of the second control signal is leading the falling edge of the first control signal, so as to control a pair of current sources to selectively discharge and charge a capacitor.

2. The jitter-less phase detector in a clock recovery circuit as claimed in claim 1, wherein the first control signal generating circuit is formed by an inverting delay circuit of 0.5T delay and an XNOR gate; the data signal is applied to an input end of the inverting delay circuit to generate an inverting delay data signal; and the data signal and the inverting delay data signal are applied to the input ends of the XNOR gate for generating a first control signal.

3. The jitter-less phase detector in a clock recovery circuit as claimed in claim 1, wherein the second control signal generating circuit is formed by a D-type flip-flop and a first XOR gate; a clock end point of the D-type flip-flop is connected to an inverted clock signal; the data signal is applied to a data input end of the D-type flip-flop; and the data signal and an output of the D-type flip-flop are connected to input ends of the XOR gate for generating the second control signal.

4. The jitter-less phase detector in a clock recovery circuit as claimed in claim 1, wherein the phase comparator is formed by a first D-type flip-flop, a second D-type flip-flop, and an AND gate; the first control signal and the second control signal are applied to inverted clock input ends of the second and first D-type flip-flops, respectively; the data input ends of the second D-type flip-flop and first D-type flip-flop are connected to high level; outputs of the first and second D-type flip-flops generate the up and down signals; the up and down signals are sent to the input ends of the AND gate; and an output of the AND gate is connected to reset ends of the first and second D-type flip-flops, respectively.

5. The jitter-less phase detector in a clock recovery circuit as claimed in claim 1, wherein the inverted delay circuit is formed by an odd number of CMOS gates providing a path delay equal to half period of a clock.

* * * * *